United States Patent
Bogi et al.

(10) Patent No.: US 11,531,363 B2
(45) Date of Patent: Dec. 20, 2022

(54) VOLTAGE TRACKING CIRCUITRY FOR OUTPUT PAD VOLTAGE

(71) Applicant: Arm Limited, Cambridge (GB)

(72) Inventors: Seshagiri Rao Bogi, Bangalore (IN); Kundan Srivastava, Bangalore (IN)

(73) Assignee: Arm Limited, Cambridge (GB)

( * ) Notice: Subject to any disclaimer, the term of this patent is extended or adjusted under 35 U.S.C. 154(b) by 149 days.

(21) Appl. No.: 16/735,620

(22) Filed: Jan. 6, 2020

(65) Prior Publication Data

US 2021/0208615 A1    Jul. 8, 2021

(51) Int. Cl.
  *G05F 1/571* (2006.01)
  *G05F 1/575* (2006.01)

(52) U.S. Cl.
  CPC .............. *G05F 1/571* (2013.01); *G05F 1/575* (2013.01)

(58) Field of Classification Search
  CPC .............................................. G05F 1/565–571
  USPC ............................................ 324/522; 702/57–67
  See application file for complete search history.

(56) References Cited

U.S. PATENT DOCUMENTS

| | | | | | |
|---|---|---|---|---|---|
| 5,576,635 A * | 11/1996 | Partovi | ................... | G05F 3/242 | 326/27 |
| 5,867,039 A * | 2/1999 | Golke | .............. | H03K 19/00315 | 326/86 |
| 5,969,563 A * | 10/1999 | Shih | ................ | H03K 19/00315 | 327/333 |
| 6,169,420 B1 * | 1/2001 | Coddington | ..... | H03K 19/00315 | 326/82 |
| 6,188,243 B1 * | 2/2001 | Liu | ................... | H03K 19/00315 | 327/333 |
| 6,339,344 B1 * | 1/2002 | Sakata | ........... | H03K 19/018528 | 326/115 |
| 6,373,282 B1 * | 4/2002 | Drapkin | ........... | H03K 19/00315 | 326/82 |
| 6,400,546 B1 * | 6/2002 | Drapkin | ........... | H03K 19/00315 | 361/111 |
| 6,414,515 B1 * | 7/2002 | Kunz | ............... | H03K 19/00315 | 326/83 |
| 6,445,211 B1 * | 9/2002 | Saripella | ............... | H03L 7/0895 | 326/83 |
| 7,215,146 B2 * | 5/2007 | Khan | ............... | H03K 3/356113 | 326/83 |
| 7,834,653 B1 * | 11/2010 | Kumar | ............. | H03K 19/00315 | 326/14 |
| 7,839,174 B2 * | 11/2010 | Wang | ............. | H03K 19/018521 | 326/26 |

(Continued)

*Primary Examiner* — Thienvu V Tran
*Assistant Examiner* — Nusrat Quddus
(74) *Attorney, Agent, or Firm* — Pramudji Law Group PLLC; Ari Pramudji

(57) ABSTRACT

Various implementations described herein are related to a device having an output pad that is configured to supply an output pad voltage. The device may include tracking circuitry that is configured to receive a first voltage, receive a second voltage that is different than the first voltage, receive the output pad voltage as a feedback voltage, and provide a first tracking voltage and a second tracking voltage based on the first voltage, the second voltage and the feedback voltage. The device may include output circuitry that is configured to receive the first tracking voltage and the second tracking voltage from the tracking circuitry and provide the output pad voltage to the output pad based on the first tracking voltage and the second tracking voltage.

12 Claims, 9 Drawing Sheets

(56) References Cited

U.S. PATENT DOCUMENTS

| | | | | |
|---|---|---|---|---|
| 7,924,056 | B2* | 4/2011 | Kumar | H03K 19/018528 |
| | | | | 330/252 |
| 8,159,262 | B1* | 4/2012 | Bhattacharya | H03K 19/00384 |
| | | | | 326/83 |
| 8,395,433 | B2* | 3/2013 | Rien | H03K 19/00315 |
| | | | | 326/82 |
| 8,421,501 | B1* | 4/2013 | Rien | H03K 19/018521 |
| | | | | 327/170 |
| 8,421,516 | B2* | 4/2013 | Kumar | H03K 19/018521 |
| | | | | 326/62 |
| 8,957,703 | B2* | 2/2015 | Rien | H03K 19/00315 |
| | | | | 327/333 |
| 9,419,613 | B2* | 8/2016 | P | H03K 19/018592 |
| 2007/0236262 | A1* | 10/2007 | McClure | H03K 19/0013 |
| | | | | 327/108 |
| 2007/0247190 | A1* | 10/2007 | Chen | H03K 19/018521 |
| | | | | 326/81 |
| 2009/0195267 | A1* | 8/2009 | Ho | H03K 19/00315 |
| | | | | 326/68 |
| 2014/0002146 | A1* | 1/2014 | Kim | H03K 17/102 |
| | | | | 327/109 |
| 2015/0070086 | A1* | 3/2015 | Tan | G11C 5/147 |
| | | | | 327/540 |
| 2016/0172350 | A1* | 6/2016 | Dey | H01L 27/0285 |
| | | | | 361/56 |
| 2019/0149149 | A1* | 5/2019 | Pan | H03K 19/018585 |
| | | | | 327/109 |

* cited by examiner

US 11,531,363 B2

VOLTAGE TRACKING CIRCUITRY FOR OUTPUT PAD VOLTAGE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some computing architecture, fail-safe operation refers to electronic circuits that are designed to prevent unsafe operation of controlled components in the event of failure of one or more internal circuit components. Thus, fail-safe circuits are designed to mitigate failure when failures occur. In reference to control logic, safe circuit operation may involve safely performing tasks, and in electrical engineering, fail-safes are typically designed to implement features or practices that respond to and mitigate specific types of failures that can cause minimal to no harm to internal circuit components.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to voltage tracking schemes and techniques. For instance, the various schemes and techniques described herein may provide for an over-drive fail-safe input/output (IO) PAD voltage tracking circuit. In some scenarios, under normal operating conditions, various circuitry may operate with a supply voltage (DVDD) of approximately 3.3V, and in other instances, under fail-safe operating conditions, various circuitry may operate with a supply voltage (DVDD) of 0V and with an intermediate voltage supply (DVDDLO) of 0V. In this instance, the IO circuitry should be in Hi-Z state when power (DVDD, DVDDLO)=0 and when the PAD is driven externally with various supply voltage levels, such as, e.g., 3.3V or 1.8V. Thus, various implementations described herein provide for gate/well voltage tracking under normal operation and under fail-safe operation. Also, various implementations described herein provide for a single tracking circuit that uses various low voltage devices, such as, e.g., 1.8V devices, for over-drive circuits that operate with power sequence independent fail-safe support in different voltage level domains (e.g., 3.3V/2.5V/1.8V). Advantages of using the voltage tracking schemes and techniques described herein may provide for over-drive (3.3V/2.5V/1.8V) fail-safe support when using 1.8V devices, multi-voltage domain fail-safe support, power sequence independence, and high-speed fail-safe support.

Various implementations of voltage tracking schemes and techniques will be described in detail herein with reference to FIGS. 1-7.

Figure 1:
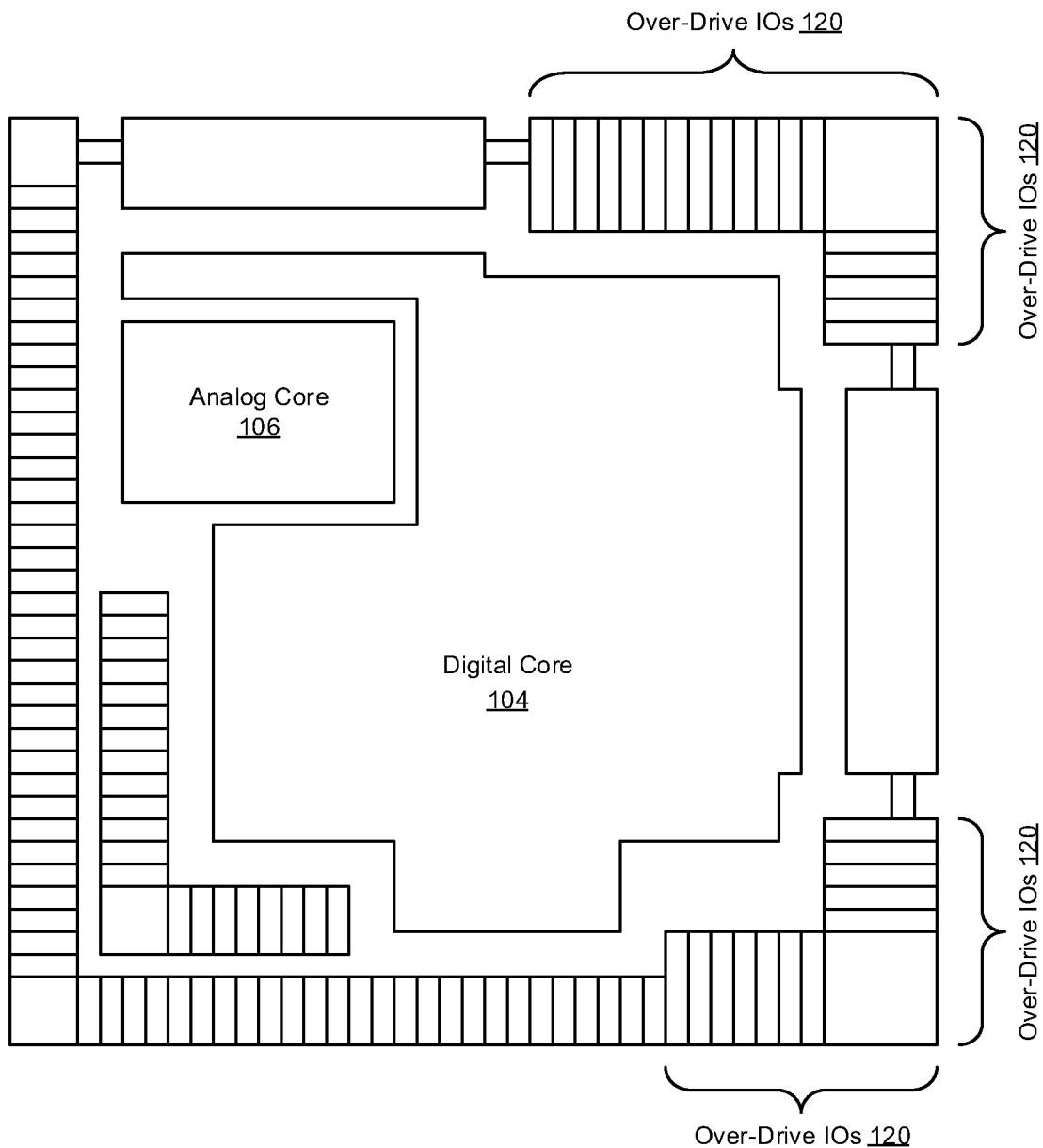
FIG. 1 illustrates a diagram of chip-level circuitry in accordance with various implementations described herein.

FIG. 1 illustrates a top view diagram of chip-level circuitry 100 in accordance with various implementations described herein.

In various implementations, the chip-level circuitry 100 may be implemented as a system or a device having various integrated circuit (IC) components that are arranged and coupled together as an assemblage or combination of parts that provide for a physical circuit design and related structures. In some instances, a method of designing, providing and building the chip-level circuitry 100 as an integrated system or device that may involve use of various IC circuit components described herein so as to thereby implement voltage tracking schemes and techniques associated therewith. The chip-level circuitry 100 may be integrated with computing circuitry and related components on a single chip, and the chip-level circuitry 100 may be implemented in various embedded systems for electronic, mobile and Internet-of-things (IoT) applications, including sensor nodes.

As shown in FIG. 1, the chip-level circuitry 100 may refer to a system-on-a-chip (SoC) that may include a digital core 104, an analog core 106, and over-drive input-output (IO) circuitry 120. In some implementations, the SoC refers to an integrated circuit (IC) that integrates various logic components on a single chip or substrate. Since some SoCs operate with low power with less area than other multi-chip designs with equivalent functionality, SoCs are advantageously implemented in mobile computing devices, edge computing devices, embedded devices and/or Internet-of-Things (IoT) devices. Also, in some implementations, the IO circuitry 120 may be utilized for communication between various internal components (e.g., 104, 106) and external components. The IO circuitry 120 may include one or more IO ports that receive input signals and/or provide output signals, and as such, the IO circuitry 120 may perform various IO operations. As further described herein, the IO circuitry 120 is configured with fail-safe circuitry for implementing fail-safe mode operational characteristics and behaviors.

Figure 2:
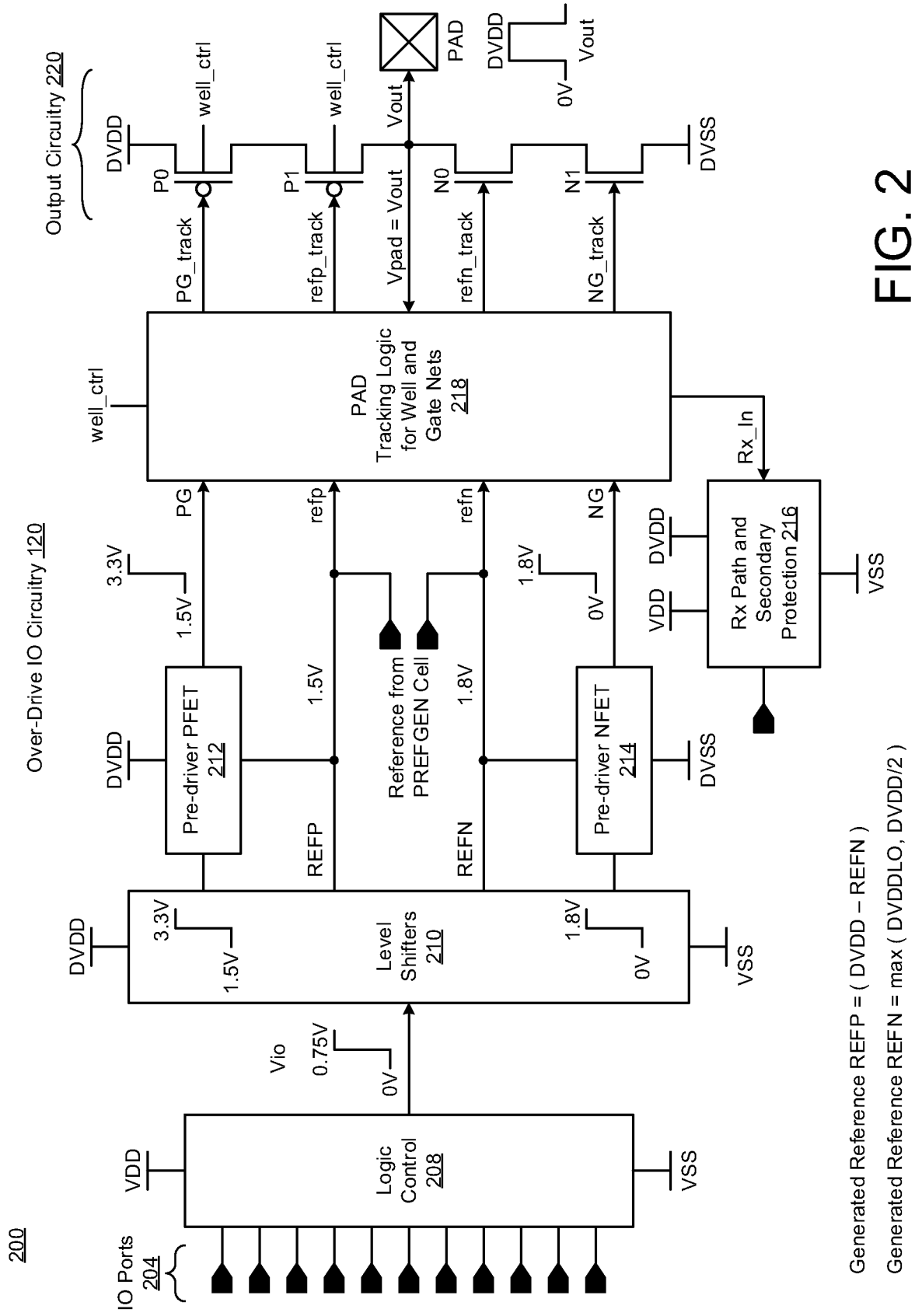
FIG. 2 illustrates a diagram of over-drive input-output circuitry in accordance with various implementations described herein.

FIG. 2 illustrates a diagram of the over-drive input-output (IO) circuitry 120 in accordance with various implementations described herein.

In various implementations, the over-drive IO circuitry 120 may be implemented as a system or device having various integrated circuit (IC) components that are arranged and coupled together as an assemblage or combination of parts that provide for a physical circuit design and related structures. In some instances, a method of designing, providing and building over-drive IO circuitry 120 as an integrated system or device that may involve use of various IC circuit components are described herein so as to thereby implement voltage tracking schemes and techniques associated therewith. The over-drive IO circuitry 120 may be integrated with computing circuitry and related components on a single chip, and the over-drive IO circuitry 120 may be implemented in embedded systems for electronic, mobile and Internet-of-things (IoT) applications, including sensor nodes.

As shown in FIG. 2, the over-drive IO circuitry 120 may include logic control circuitry 208 having one or more IO ports 204 that are configured to receive one or more IO signals from internal sources and/or external sources. In some instances, the internal sources may refer to on-chip devices associated with the chip-level circuitry 102 as shown in FIG. 1, such as, e.g., the digital core 104 and/or the analog core 106, and also, the external sources may refer to off-chip devices that are external to the chip-level circuitry 102 in FIG. 1. In various instances, the logic control circuitry 208 may be coupled to a first voltage domain, such as, e.g., core voltage domain that may be configured to provide a core supply voltage (VDD) and a core ground supply voltage (VSS). Also, in various instances, one or more components of the over-drive IO circuitry 120 may be coupled to a second voltage domain, such as, e.g., an IO voltage domain that may be configured to provide an IO supply voltage (DVDD) and an IO ground supply voltage (DVSS).

The over-drive IO circuitry 120 may include input circuitry (210, 212, 214) that is configured to receive an IO voltage (Vio), provide a first voltage (PG) based on the IO voltage (Vio), and provide a second voltage (NG) based on the IO voltage (Vio) that is different than the first voltage (PG). In some instances, the IO voltage (Vio) may refer to an over-drive input-output (IO) voltage, and the input circuitry (210, 212, 214) may include level shifting circuitry 210 that receives the over-drive IO voltage (Vio), provides the first voltage (PG) based on the over-drive IO voltage (Vio), and provides the second voltage (NG) based on the over-drive IO voltage (Vio). The logic control 208 may be configured to provide the IO voltage (Vio) within a voltage range of 0V to 0.75V, and the level shifting circuitry 210 may include level shifters that are configured to receive the IO voltage (Vio) and provide the first voltage (PG), the second voltage (NG), a first reference voltage (REFP) and a second reference voltage (REFN).

In a first mode of operation, the first voltage (PG) may be within a voltage range of 1.5V and 3.3V, the second voltage (NG) may be within a voltage range of 0V and 1.8V, the first reference voltage (REFP) may be 1.5V, and the second reference voltage (REFN) may be 1.8V. In a second mode of operation, the first voltage (PG) may operate within a voltage range of 0.7V and 2.5V, the second voltage (NG) may remain within a voltage range of 0V and 1.8V, the first reference voltage (REFP) may be 0.7V, and the second reference voltage (REFN) may remain at 1.8V. Also, in a third mode of operation, the first voltage (PG) may be within a voltage range of 0V and 1.8V, the second voltage (NG) may remain within a voltage range of 0V and 1.8V, the first reference voltage (REFP) may be 0V, and the second reference voltage (REFN) may remain at 1.8V.

The input circuitry (210, 212, 214) may include a first device 212, such as, e.g., a pre-driver PFET, that may be configured to receive the first voltage (PG), receive the first reference voltage (REFP), and provide the first voltage (PG) to the voltage tracking circuitry 218 based on PG and REFP. Also, the input circuitry (210, 212, 214) may include a second device 212, such as, e.g., a pre-driver NFET, that may be configured to receive the second voltage (NG), receive the second reference voltage (REFN), and provide the second voltage (NG) to the voltage tracking circuitry 218 based on NG and REFN. Also, in some instances, a reference voltage from a PREFGEN cell may be provided to the first reference voltage (REFP) line and to the second reference voltage (REFN) line.

In some implementations, the first voltage (PG) may refer to a first operating voltage in a first range, and also, the second voltage (NG) may refer to a second operating voltage in a second range that is different than the first range. In some instances, the first range may refer to a voltage range between a first intermediate voltage (e.g., 1.5V) and an upper boundary voltage (e.g., 3.3V), and also, the second range may refer to a voltage range between a lower boundary voltage (e.g., 0V) and a second intermediate voltage (1.8V). In some instances, the level shifting circuitry 210 may be configured to provide a first reference voltage (refp) and a second reference voltage (refn) that is different than the first reference voltage (refp). In some instances, the first reference voltage (refp) may refer to a voltage level that is similar to the first intermediate voltage (e.g., 1.5V), and also, the second reference voltage (refn) may refer to another voltage level that is similar to the second intermediate voltage (e.g., 1.8V).

The over-drive IO circuitry 120 may include voltage tracking circuitry 218 that is configured to receive the first voltage (PG), receive the second voltage (NG), provide a first tracking signal (PG_track) based on the first voltage (PG), and provide a second tracking signal (NG) based on the second voltage (NG). The tracking circuitry 218 may receive the first reference voltage (refp) and provide a first reference tracking signal (refp_track) based on the first reference voltage (refp), and also, the tracking circuitry 218 may receive the second reference voltage (refn) and provide a second reference tracking signal refn_track) based on the second reference voltage (refn).

In some instances, the voltage tracking circuitry 218 may be referred to as PAD tracking logic for well and gate nets. Also, in some instances, the first voltage (PG) may refer to a first operating voltage that operates within the first intermediate voltage (e.g., 1.5V) and the upper boundary voltage (e.g., 3.3V). The second voltage (NG) may refer to a second operating voltage that is different than the first operating voltage, wherein the second operating voltage operates within the lower boundary voltage (e.g., 0V) and the second intermediate voltage (e.g., 1.8V). Further, the first voltage (PG) may be referred to as a first gate voltage, and the first tracking voltage may be referred to as a first gate tracking voltage, and also, in this instance, the second voltage (NG) may be referred to as a second gate voltage, and the second tracking voltage may be referred to as a second gate tracking voltage. In various instances, the upper boundary voltage may vary under different operating conditions; e.g., in different modes of operation, the upper boundary voltage may refer to a first voltage level (e.g., 3.3V), a second voltage level (e.g., 2.5V), or a third voltage level (e.g., 1.8V). In this instances, the first reference voltage (refp) may also vary under the different operating conditions; e.g., in the first voltage level (e.g., 3.3V), the first reference voltage (refp) may refer to 1.5V; in the second voltage level (e.g., 2.5V), the first reference voltage (refp) may refer to 0.7V; and in a third voltage level (e.g., 1.8V), the first reference voltage (refp) may refer to 0V. Also, the second reference voltage (refn) may remain at the second intermediate voltage (e.g., 1.8V).

The over-drive IO circuitry 120 may include receiver (Rx) circuitry 216 that may be coupled between the voltage tracking circuitry 218 and one or more components of the chip-level circuitry 102 in FIG. 1. In some implementations, the Rx circuitry 216 may operate as a secondary protection circuit, and the Rx circuitry 216 may provide a receiver (Rx) path for communication between the voltage tracking circuitry 218 and components of the chip-level circuitry 102. For instance, the voltage tracking circuitry 218 may provide an Rx_In signal to the Rx circuitry 216, and the Rx circuitry 216 may receive the Rx_In signal, receive the core voltage (VDD), receive the IO voltage (DVDD), receive the ground voltage (VSS), and provide an output control/data signal to the digital core 104 and/or the analog core 106 of the chip-level circuitry 102 in FIG. 1. In some instances, the digital and/or analog core circuitry 104, 106 may alter and/or modify operational characteristics and/or behavior based on the output control/data signal from the Rx circuitry 216.

The over-drive IO circuitry 120 may include output circuitry 220 having switch structures (e.g., P0, P1, N0, N1) that are configured to receive the first tracking signal (PG_track), receive the second tracking signal (NG), and provide an output pad voltage (Vpad or Vout) to a node associated with the output pad (PAD) based on the first tracking signal (PG_track) and the second tracking signal (NG). In some instances, the output circuitry 220 may be coupled to a second voltage domain, such as, e.g., an IO voltage domain that is between a first supply voltage (DVDD) and a second supply voltage (DVSS). In some instances, the switch structures (e.g., P0, P1, N0, N1) may include a first transistor (P0), a second transistor (P1), a third transistor (N0) and a fourth transistor (P1) that are coupled in series between the first supply voltage (DVDD) and the second supply voltage (DVSS). In addition, the first supply voltage (DVDD) may refer to a source voltage (or IO supply voltage) of 3.3V, 2.5V, 1.8V, and the second supply voltage (DVSS) may refer to a ground voltage (or IO ground supply voltage) of 0V.

In some implementations, the first transistor (P0) may be coupled between the first supply voltage (DVDD) and the second transistor (P1), and also, the second transistor (P1) may be coupled between the first transistor (P0) and the output pad (PAD). In some instances, the first supply voltage (DVDD) may be provided to the output pad (PAD) as the output pad voltage (Vout) when the first transistor (P0) and the second transistor (P1) are activated. The tracking circuitry 218 may provide the first tracking signal (PG_track) to a gate of the first transistor (P0), and also, the first transistor (P0) may provide the first supply voltage (DVDD) to the second transistor (P1) when activated by the first tracking signal (PG_track). Further, in some instances, the tracking circuitry 218 may provide the first reference tracking signal (refp_track) to a gate of the second transistor (P1), and also, the second transistor (P1) may provide the first supply voltage (DVDD) to the output pad (PAD) when activated by the second reference tracking signal (refn).

In some implementations, the third transistor (N0) may be coupled between the output pad (PAD) and the fourth transistor (N1), and also, the fourth transistor (N1) may be coupled between the third transistor (N0) and the second supply voltage (DVSS). In some instances, the second supply voltage (DVSS) may be provided to the output pad (PAD) as the output pad voltage (Vout) when the third transistor (N0) and the fourth transistor (N1) are activated. The tracking circuitry 218 may provide the second tracking signal (refn) to a gate of the fourth transistor (N1), and also, the fourth transistor (N1) may provide the second supply voltage (DVSS) to the third transistor (N0) when activated by the second tracking signal (NG). Further, in some instances, the tracking circuitry 218 may provide the second reference tracking signal (refn) to a gate of the third transistor (N0), and also, the third transistor (N0) may provide the second supply voltage (DVSS) to the output pad (PAD) when activated by the second reference tracking signal (refn).

In some implementations, as shown in FIG. 2, the output pad (PAD) may be configured to supply the output pad voltage (Vpad or Vout), and the tracking circuitry 218 may be configured to receive the first voltage (PG), the second voltage (NG) and also the output pad voltage (Vpad or Vout) as a feedback voltage. Also, the tracking circuitry 218 may be configured to provide the first tracking voltage (PG_track) and the second tracking voltage (NG) based on the first voltage (PG), the second voltage (NG) and the feedback voltage (Vpad or Vout). Further, as shown in FIG. 2, the output circuitry 220 may be configured to receive the first tracking voltage (PG_track) and the second tracking voltage (NG) from the tracking circuitry 218 and provide the output pad voltage (Vpad or Vout) to the output pad (PAD) based on the first tracking voltage (PG_track) and the second tracking voltage (NG).

In some implementations, the voltage tracking circuitry 218 may be configured to provide a well control signal (well_ctrl) that is applied as a biasing voltage to the wells of various transistors in the over-drive circuitry 120, such as, e.g., the first transistor (P0) and the second transistor (P1) of the output circuitry 220. As further described herein, the well control signal (well_ctrl) may be applied to other transistors for biasing purposes.

In various instances, the first supply voltage (DVDD) may vary under different operating conditions; e.g., in different modes of operation, wherein the first supply voltage (DVDD) may refer to the first level (e.g., 3.3V), the second level (e.g., 2.5V), or the third level (e.g., 1.8V). Thus, the first supply voltage may operate between an upper boundary voltage (3.3V, 2.5V, 1.8V) and a corresponding first intermediate voltage (1.5V, 0.7V, 0V), and also, the second supply voltage my operate between the lower boundary voltage (0V) and the second intermediate voltage (1.8V). In this instance, the first reference voltage (refp) may be generated from the first supply voltage (DVDD) minus the second reference voltage (refn) such that: REFP=DVDD−REFN. Also, the second reference voltage (refn) may be generated from a maximum value of the first supply voltage (DVDD), such that: REFN=max (DVDDLO, DVDD/2), wherein DVDDLO may vary across PVT from 1.62V to 1.98V. Thus, REFN max voltage may be 1.98V.

In some instances, the over-drive IO circuitry 120 may operate under a fail-safe condition, wherein during the fail-safe condition, the first supply voltage (DVDD) is similar to the lower boundary voltage (0V), and also, the output pad voltage (Vpad or Vout) refers to the upper boundary voltage (3.3V, 2.5, 1.8V). Further, as described herein, the over-drive IO circuitry 120 may operate under different operating conditions, e.g., in different modes of operation. For instance, during a first mode of operation, the first supply voltage (DVDD) is similar to the upper boundary voltage at the first level (e.g., 3.3V), the second reference voltage (refn) is similar to the second intermediate voltage (e.g., 1.8V), and the second supply voltage (DVSS) is similar to the lower boundary voltage (0V). Thus, in this instance, the first reference voltage (refp) may be similar to the upper boundary voltage at the first level (e.g., 3.3V) minus the second intermediate voltage (e.g., 1.8V), which is similar to the first intermediate voltage (1.5V).

In another instance, during a second mode of operation, the first supply voltage (DVDD) is similar to the upper boundary voltage at the second level (e.g., 2.5V) that is less than the first level (e.g., 3.3V), the second reference voltage (refp) is similar to the second intermediate voltage (e.g., 1.8V), and the second supply voltage is similar to the lower boundary voltage (0V). Thus, in this instance, the first reference voltage (refp) may be similar to the upper boundary voltage at the second level (e.g., 2.5V) minus the second intermediate voltage (e.g., 1.8V), which is (0.7V).

In another instance, during a third mode of operation, the first supply voltage (DVDD) is similar to the upper boundary voltage at the third level (e.g., 1.8V) that is less than the second level (e.g., 2.5V), the second reference voltage (refn) is similar to the second intermediate voltage (e.g., 1.8V), and the second supply voltage (DVSS) is similar to the lower boundary voltage (0V). Thus, in this instance, the first reference voltage (refp) is similar to the upper boundary voltage at the third level (e.g., 1.8V) minus the second intermediate voltage (e.g., 1.8V), which refers to the lower boundary voltage (0V).

Figure 3A:
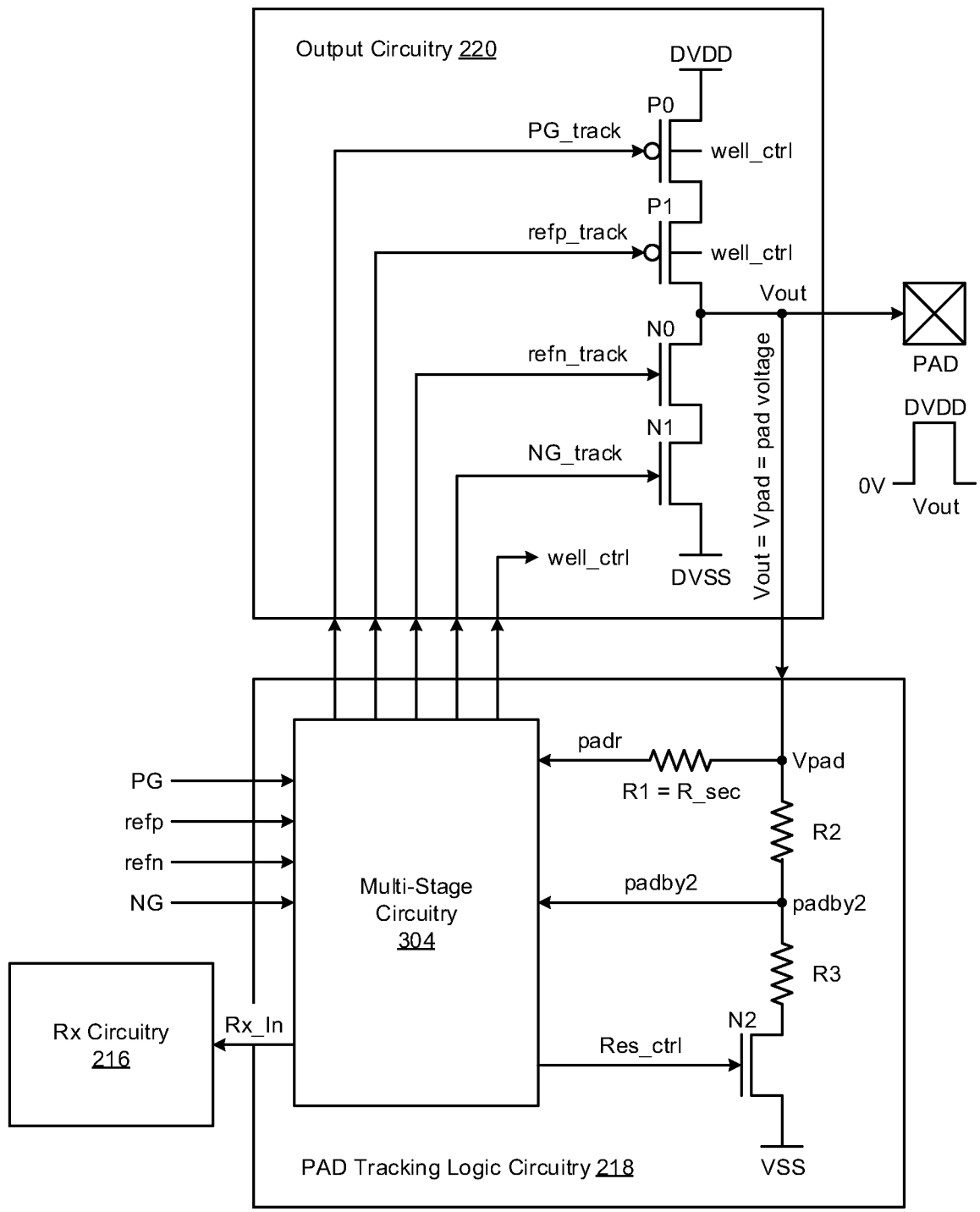
FIGS. 3A-3B illustrate a diagrams of voltage tracking circuitry in accordance with various implementations described herein.
Figure 3B:
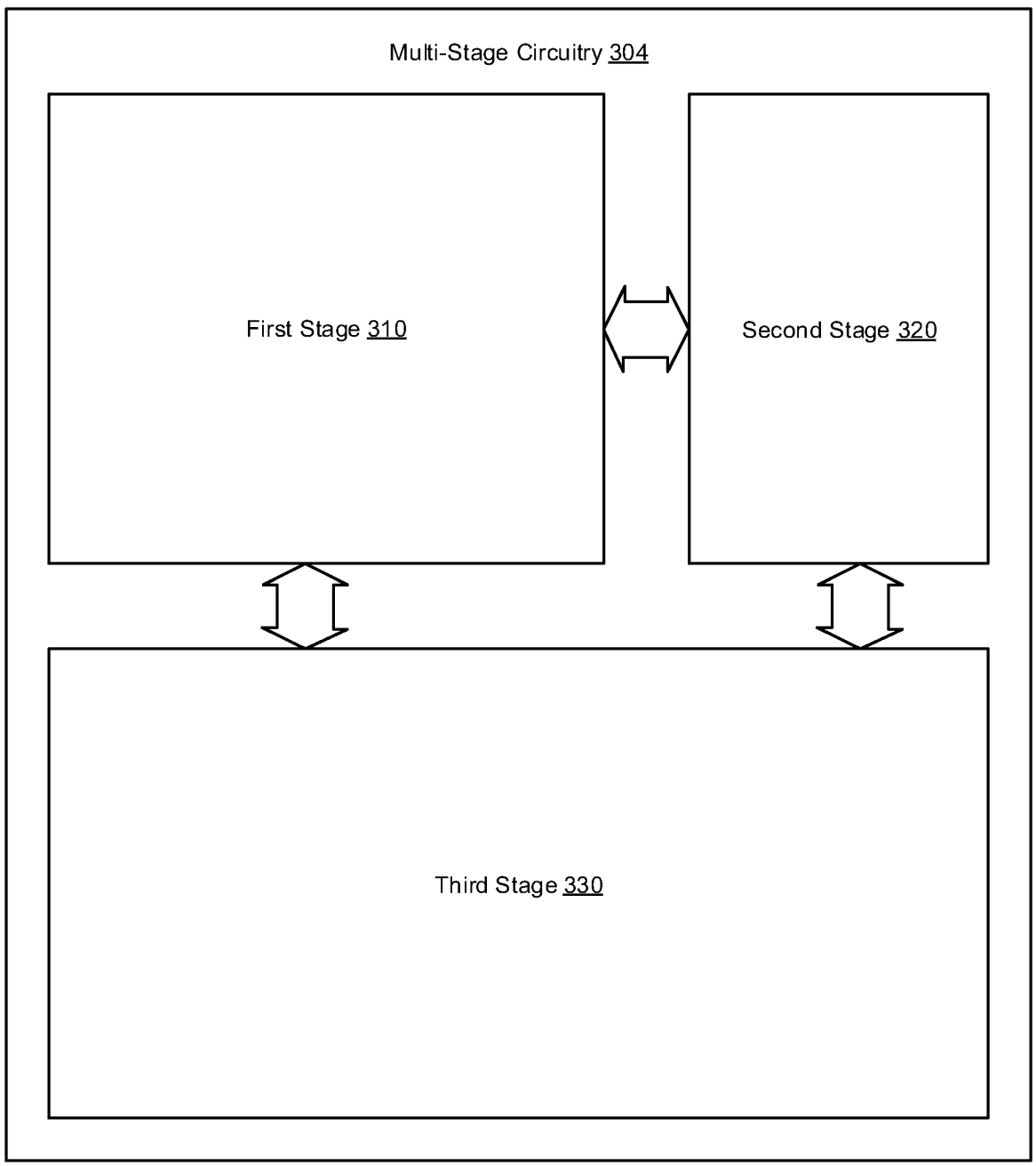

FIGS. 3A-3B illustrate diagrams of the voltage tracking circuitry in accordance with various implementations described herein. In particular, FIG. 3A shows a diagram 300A of voltage tracking circuitry 302 having the PAD tracking logic circuitry 218, and in addition, FIG. 3B shows a diagram 300B of multi-stage circuitry 304 of the PAD tracking logic circuitry 218, which is further described herein in FIGS. 4-6B. In some instances, the PAD tracking logic circuitry 218 of FIGS. 3A-3B refers to the voltage tracking circuitry 218 in FIG. 2, which may also be referred to as voltage tracking logic. The PAD tracking logic circuitry 218 may be configured to support 3.3V/2.5V/1.8V fail-safe operation using 1.8V devices, and the PAD tracking logic circuitry 218 may also be configured to support multi-mode 3.3V/2.5V/1.8V fail-safe operation.

As shown in FIG. 3A, the voltage tracking circuitry 302 may include an output stage (e.g., the output circuitry 220) having multiple output transistors (e.g., P0, P1, N0, N1) that are configured to receive the first tracking signal (PG_track), receive the second tracking signal (NG), and provide the output pad signal (Vpad/Vout) to the output pad (PAD) based on the first tracking signal (PG_track) and the second tracking signal (NG). The voltage tracking circuitry 302 may include the PAD tracking logic circuitry 218 having a feedback stage (R1, R2, R3, N2) and multi-stage circuitry 304. In some instances, the feedback stage may be configured to receive the output pad signal (Vpad or Vout) from the output stage 220 and provide a pad feedback signal (padby2) based on the output pad signal (Vpad or Vout). The tracking stage 218 may include the multi-stage circuitry 304 that is configured to receive the first signal (PG), receive the second signal (NG), receive the output pad signal (Vpad/Vout as padr from R1) from the output pad (PAD), receive the pad feedback signal (padby2) from the feedback stage (R2, R3, N2), and provide the first tracking signal (PG_track) and also the second tracking signal (NG) to the output stage 220 based on the first signal (PG), the second signal (NG), the output pad signal (padr), and the pad feedback signal (padby2). Also, the multi-stage circuitry 304 may be configured to provide the well control signal (well_ctrl) as a biasing voltage to the wells of various transistors, such as, e.g., the first transistor (P0) and the second transistor (P1) of the output stage 220.

In some implementations, the first transistor (P0) and the second transistor (P1) may be implemented with P-type transistors, and the third transistor (N0) and the fourth transistor (N1) may be implemented with N-type transistors. However, in other instances, the transistors (P0, P1) may be implemented with N-type transistors, and the transistors (N0, N1) may be implemented with P-type transistors.

The feedback stage may be configured to receive the output pad signal (Vpad or Vout) from the output stage 220 and provide a pad feedback signal (padby2) based on the output pad signal (Vpad or Vout). The feedback stage may include a first resistor (R1 or R_sec) that receives the output pad signal (Vpad or Vout) from the output stage 220 and provides the output pad signal (Vpad/Vout as padr from R1) as an input padr voltage to the multi-stage circuitry 304. In some instances, the first resistor R1 has a resistance value of 500 Ω (500 Ohms). In various other instances, the first resistor R1 may have various other resistance values.

The feedback stage may include a second resistor R2 that receives the output pad signal (Vpad or Vout) from the output stage 220 and provides the pad feedback signal (padby2) as an input padby2 voltage to the multi-stage circuitry 304. In some instances, the second resistor R2 has a resistance value of 400 kΩ (400 Kilo-Ohms). In various other instances, the second resistor R2 may have various other resistance values.

The feedback stage may include a third resistor R3 that receives the pad feedback signal (padby2) from the second resistor R2 and provides the pad feedback signal (padby2) to the transistor (N2). In some instances, the third resistor R3 may have a resistance value of 400 kΩ (400 Kilo-Ohms). In various other instances, the third resistor R3 may have various other resistance values.

The feedback stage may include the transistor (N2) that is coupled between the third resistor R3 and ground (VSS). In some instances, the multi-stage circuitry 304 may provide a resistor control signal (Res_ctrl) to a gate of the transistor (N2). Also, in some instances, the transistor (N2) is implemented with an N-type transistor; however, in other instances, the transistor (N2) may be implemented with a P-type transistor.

In some instances, the first signal (PG) may refer to a first operating voltage in the first range, and the second signal (NG) may refer to the second operating voltage in the second range that is different than the first range. The tracking circuitry 218 may be configured to receive the first reference signal (refp), receive the second reference signal (refn), provide the first reference tracking signal (refp_track) based on the first reference signal (refp), and provide the second reference tracking signal (refn_track) based on the second reference signal (refn). The first reference signal (refp) may be related to the first operating voltage (PG), and also, the second reference signal (NG) may be related to the second operating voltage (NG).

In some instances, the output circuitry 220 may include the output transistors (P0, 1, N0, N1) as switch structures that are configured to receive the first tracking signal (PG_track) from the tracking circuitry 218, receive the second tracking signal (NG) from the tracking circuitry 218, and provide the output pad voltage (Vpad or Vout) to the output pad (PAD) based on the first tracking voltage (PG_track) and the second tracking voltage (NG). The output transistors may include a first transistor (P0) and a second transistor (P1) along with a third transistor (N0) and a fourth transistor (N1).

The first transistor (P0) is coupled between the first supply voltage (DVDD) and the second transistor (P1), and the second transistor (P1) is coupled between the first transistor (P1) and the output pad (PAD). The first supply voltage (DVDD) is provided to the output pad (PAD) as the output pad voltage (Vpad or Vout) when the first transistor (P0) and the second transistor (P1) are activated. The tracking circuitry 218 provides the first tracking signal (PG_track) to a gate of the first transistor (P0), and the first transistor (P1) provides the first supply voltage (DVDD) to the second transistor (P1) when activated by the first tracking signal (PG_track). In addition, the tracking circuitry 218 provides the first reference tracking signal (refp_track) to a gate of the second transistor (P1), and the second transistor (P1) provides the first supply voltage (DVDD) to the output pad (OUT) when activated by the second reference tracking signal (refn_track).

The third transistor (N0) is coupled between the output pad (PAD) and the fourth transistor (P1), and the fourth transistor (N1) is coupled between the third transistor (P0) and the second supply voltage (DVSS). The second supply voltage (DVSS) is provided to the output pad (PAD) as the output pad voltage (Vpad or Vout) when the third transistor (N0) and the fourth transistor (N1) are activated. The tracking circuitry 218 provides the second tracking signal (NG) to a gate of the fourth transistor (N1), and the fourth transistor (N1) provides the second supply voltage (DVSS) to the third transistor (N0) when activated by the second tracking signal (NG). Also, the tracking circuitry 218 provides the second reference tracking signal (refn) to a gate of the third transistor (N0), and the third transistor (N0) provides the second supply voltage (DVSS) to the output pad (PAD) when activated by the second reference tracking signal (refn).

The voltage tracking circuitry 302 may include the Rx circuitry 216, which may be coupled to one or more components of the chip-level circuitry 102 in FIG. 1. In some instances, the Rx circuitry 216 may operate as a secondary protection circuit and provide an Rx path for communication between the multi-stage circuitry 304 and components 104, 106 of the chip-level circuitry 102. For instance, the multi-stage circuitry 304 may provide the Rx_In signal to the Rx circuitry 216, and as described above, the Rx circuitry 216 may receive the Rx_In signal, receive the multiple input voltages (VDD, DVDD, VSS), and then provide an output control/data signal to the digital core 104 and/or the analog core 106 of the chip-level circuitry 102. In some instances, the digital and/or analog core circuitry 104, 106 may alter, change and/or modify various operational characteristics and/or behavior based on the output control/data signal from the Rx circuitry 216.

As shown in FIG. 3B, the PAD tracking logic circuitry 218 (or voltage tracking circuitry) may include the multi-stage circuitry 304 having a first stage 310, a second stage 320 and a third stage 330 that are coupled together, arranged and configured for voltage tracking schemes and techniques in a manner as described herein. In some instances, the multi-stage circuitry 310, 320, 330 may be configured to operate as a tracking stage that receives input signals (e.g., PG, NG, refp, refn) and that also provides tracking signals (e.g., PG_track, NG, refp_track, refn_track). The input signals may include the first gate voltage signal (PG), the second gate voltage signal (NG), the first reference voltage signal (refp), and the second reference voltage signal (refn). The tracking signals may include the first gate tracking voltage signal (PG_track), the second gate tracking voltage signal (NG), the first reference tracking voltage signal (refp_track), and the second reference tracking voltage signal (refn_track). As described in reference to FIGS. 2-3A, the tracking signals (PG_track, NG, refp_track, refn_track) may be provided to the output stage circuitry 220 having the multiple output transistors (switch structure: P0, P1, N0, N1) that may be configured to receive the tracking signals and provide the output pad voltage (Vpad or Vout) based on the tracking signals.

Figure 4:
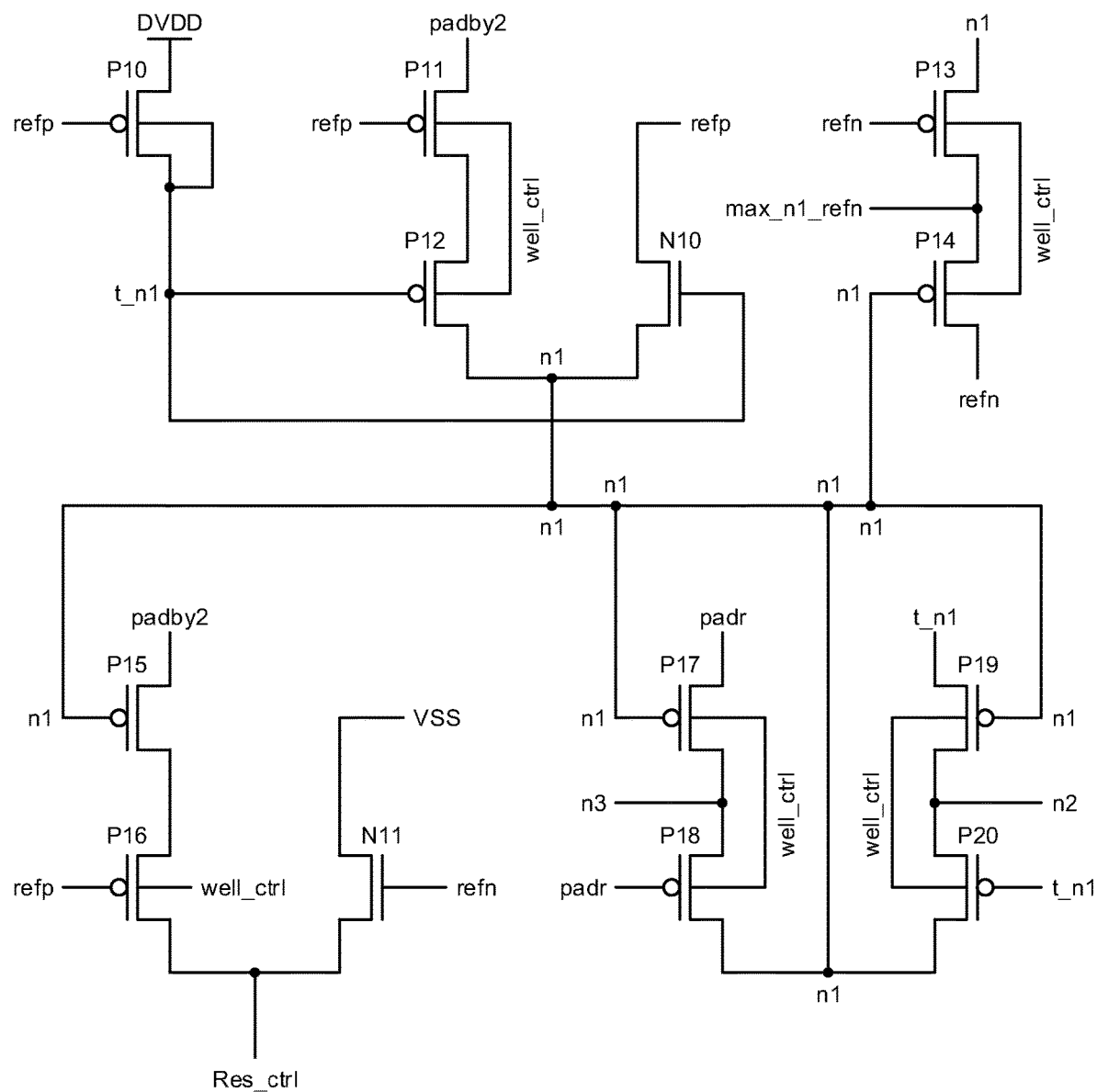
FIG. 4 illustrates a diagram of first stage circuitry in accordance with various implementations described herein.

FIG. 4 illustrates a transistor-level diagram 400 of the first stage circuitry 310 in accordance with various implementations described herein. Various implementations described herein in reference to FIGS. 4-6B may provide for a single tracking circuit that uses various low voltage devices, such as, e.g., 1.8V transistor based devices, for over-drive circuits that operate with power sequence independent fail-safe support in different voltage level domains (e.g., 3.3V/2.5V/1.8V).

As shown in FIG. 4, the first stage circuitry 310 includes multiple transistors of different types, such as, e.g., P-type transistors (P10, P11, P12, P13, P14, P15, P16, P17, P18, P19, P20) and N-type transistors (N11), that are coupled together, arranged, and configured to operate as the first stage circuitry 310.

For instance, transistor P10 is coupled between DVDD and a gate of transistor N10 at node (t_n1), and transistor P10 is activated by the first reference tracking signal (refp). Transistors P11 and P12 are coupled in series between the padby2 voltage signal and transistor N10 at node (n1). Transistor P11 is activated by the first reference tracking signal (refp), and transistor P12 is activated by the node voltage at node (t_n1). Transistor N10 is coupled between the first reference tracking signal (refp) and transistor N12 at node (n1), and transistor N10 is activated by the node voltage at node (t_n1). Transistors P13 and P14 are coupled in series between the node (n1) and the second reference voltage signal (refn). Transistor P13 is activated by the second reference voltage signal (refn), and transistor P14 is activated by the node voltage at node (n1). The max_n1_refn signal is taken from the node disposed between transistors P13, P14.

Also, transistors P15 and P16 are coupled in series between the padby voltage signal and transistor N11. Transistor P15 is activated by the node voltage at node (n1), and transistor P16 is activated by the first reference voltage signal (refp). Transistor N11 is coupled between the ground voltage signal (Vss) and transistor P16, and transistor N111 is activated by the second reference voltage signal (refn). The Res_ctrl signal is taken from the node disposed between transistors P16, N11.

Also, transistors P17 and P18 are coupled in series between the padr voltage signal and transistor P20 at node (n1). Transistor P17 is activated by the node voltage at node (n1), and transistor P18 is activated by the padr voltage signal. The node voltage at node (n3) is taken from the node disposed between transistors P17, P18. Transistors P19 and P20 are coupled in series between the node (t_n1) and transistor P18 at node (n1). Transistor P19 is activated by the node voltage at node (n1), and transistor P20 is activated by the node voltage at node (t_n1). The node voltage at node (n2) is taken from the node disposed between transistors P19, P20.

Figure 5:
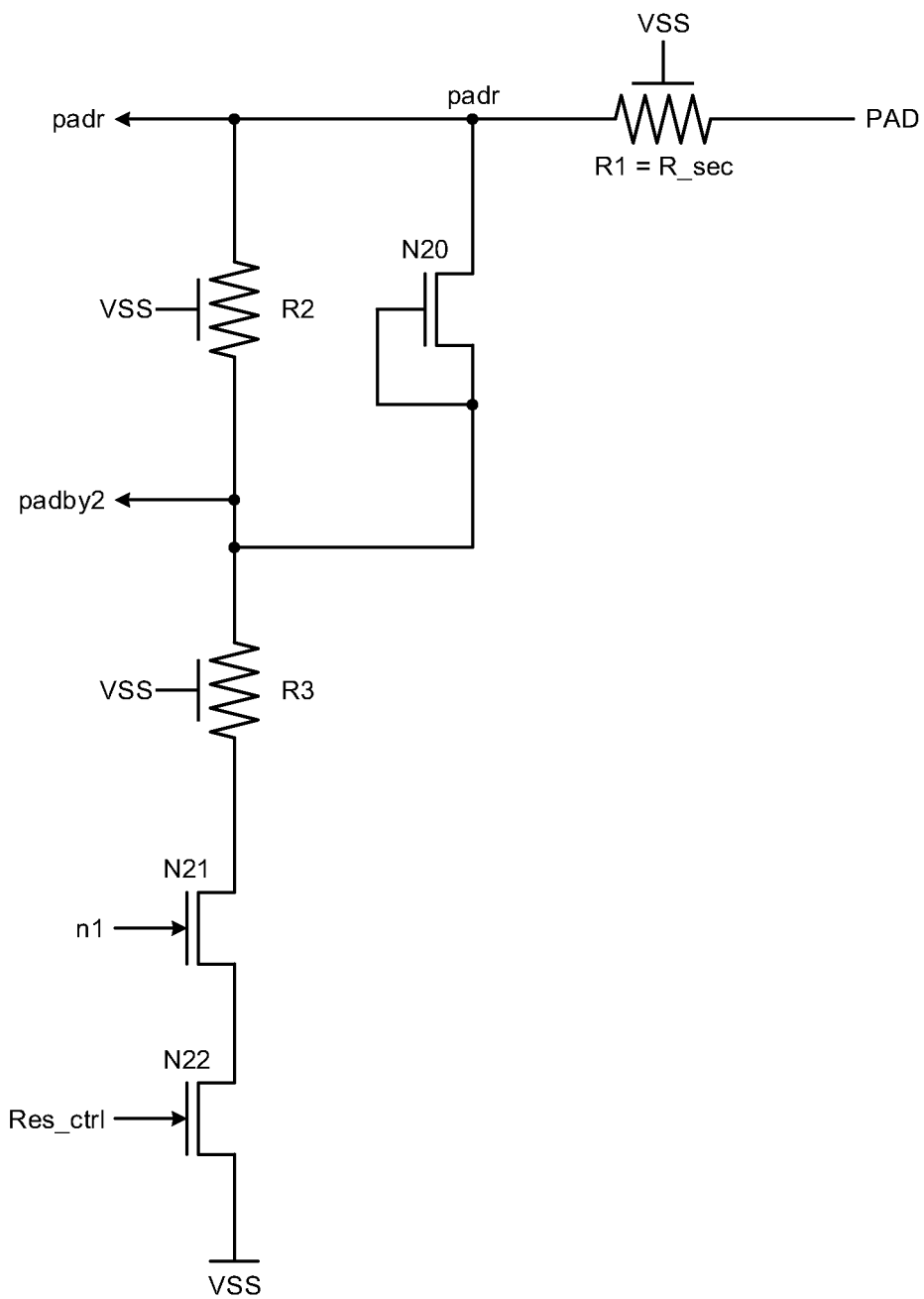
FIG. 5 illustrates a diagram of second stage circuitry in accordance with various implementations described herein.

FIG. 5 illustrates a transistor-level diagram 500 of second stage circuitry 320 in accordance with various implementations described herein. The second stage circuitry 320 may refer to the output stage circuitry 220 of FIGS. 1-2.

As shown in FIG. 5, the second stage circuitry 320 may include transistors of one or more types, such as, e.g., N-type transistors (N20, N21, N22), and one or more resistors (R1, R2, R3) that are coupled together, arranged, and configured to operate as the second stage circuitry 320. The resistors (N20, N21, N22) may be grounded to VSS via a substrate connection or similar.

For instance, resistor R1 (R_sec) is coupled between the output pad (PAD) and node (padr), which provides the padr voltage signal. Transistor N20 is coupled between the node (padr) and the node (padby2), and transistor N20 is coupled together to operate as a diode. Resistor R2 is coupled between node (padr) and node (padby2), and resistor R3 is coupled between resistor R2 at node (padr) and transistor N21. Transistors N21, N22 are coupled between resistor R3 and ground (VSS). Transistor N21 is activated by the node voltage at node (n1), and also, transistor N22 is activated by the Res_ctrl voltage signal. In some instances, resistor R1 is 500 Ω (500 Ohms), resistor R2 is 400 kΩ (400 Kilo-Ohms), and resistor R3 is 400 kΩ (400 Kilo-Ohms).

Figure 6A:
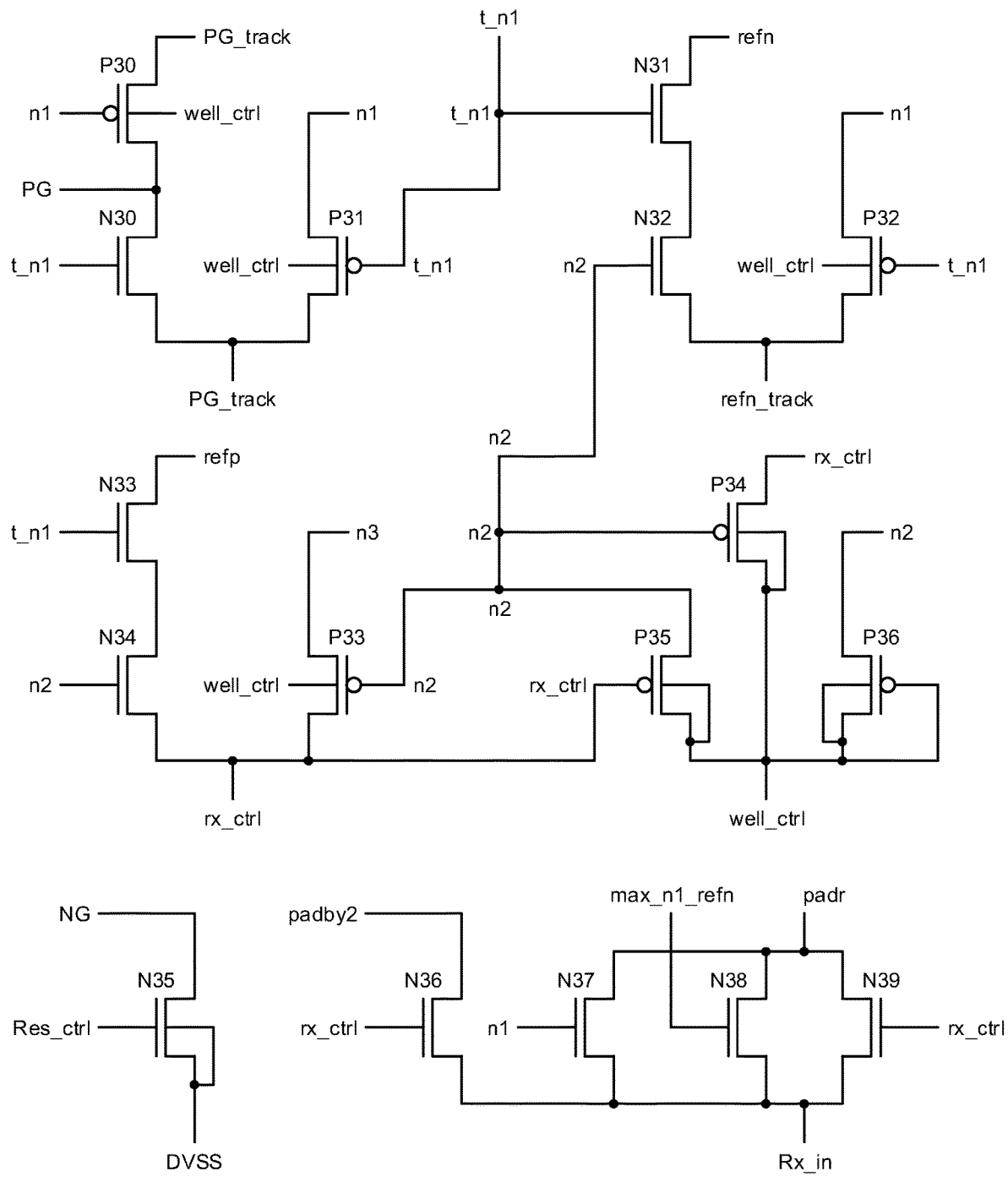
FIGS. 6A-6B illustrate various diagrams of third stage circuitry in accordance with various implementations described herein.
Figure 6B:
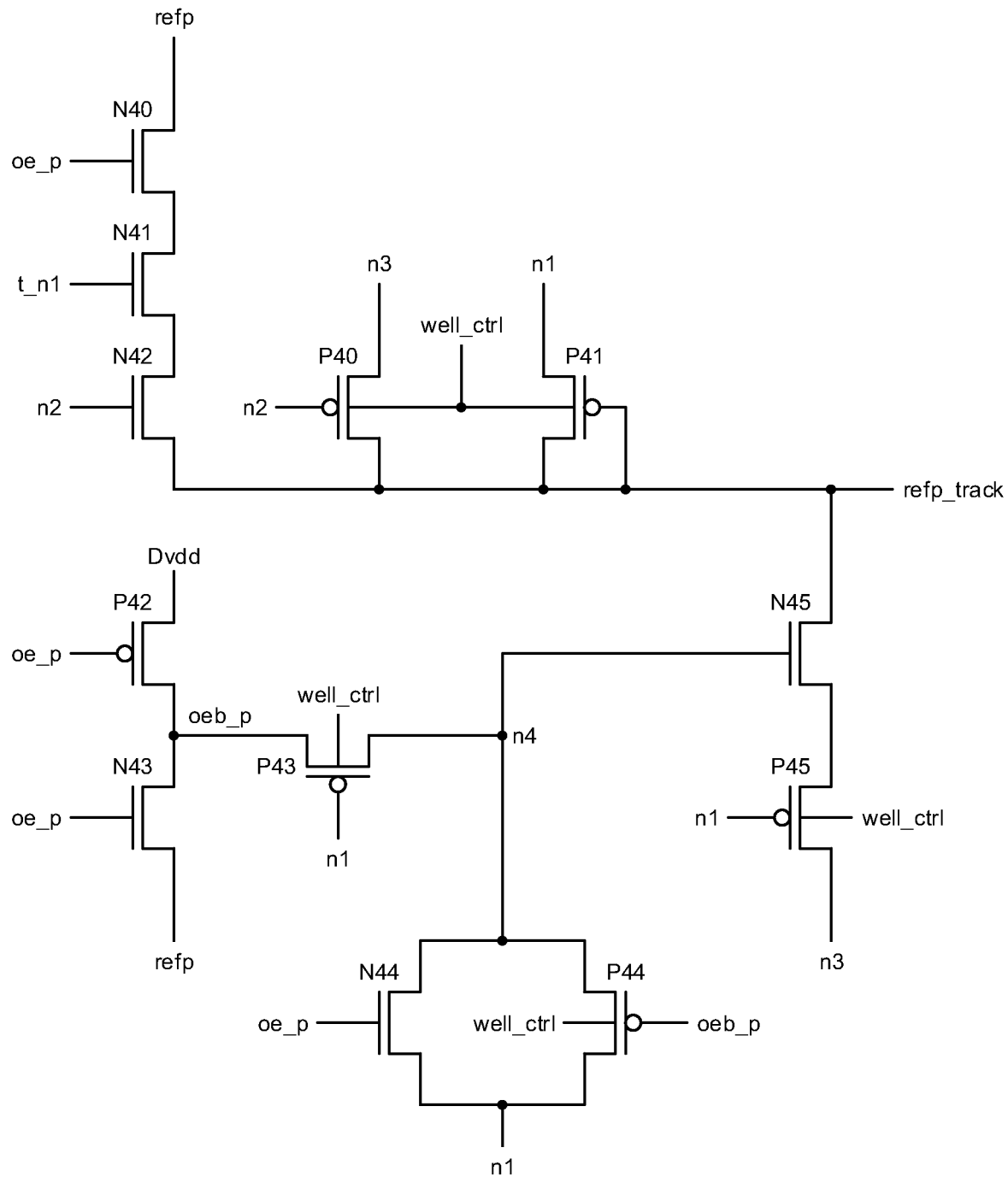

FIGS. 6A-6B illustrate transistor-level diagrams of the third stage circuitry 330 in accordance with implementations described herein. In particular, FIG. 6A shows a first transistor-level diagram 600A of a first circuit part of the third stage circuitry 330, and also, FIG. 6B shows a second transistor-level diagram 600A of a second circuit part of the third stage circuitry 330. The first circuit part in FIG. 6A and the second circuit part in FIG. 6B of the third stage circuitry 330 are coupled together, arranged, and configured to operate as the third stage circuitry 330 in a manner as described herein.

As shown in FIG. 6A, the first circuit part of the third stage circuitry 330 may include multiple transistors of different types, such as, e.g., P-type transistors (P30, P31, P32, P33, P34, P35, P36) and N-type transistors (N30, N31, N32, N33, N34, N35, N36, N37, N38, N39), that are coupled together, arranged, and configured to operate as the first circuit part of the third stage circuitry 330.

For instance, transistors P30 and N30 are coupled in series between the first tracking voltage signal (PG_track) and transistor P31. Transistor P30 is activated by the node voltage at node (n1), and transistor N30 is activated by the node voltage at node (t_n1). The first tracking voltage signal (PG_track) is coupled to a node disposed between transistors N30, P31. Transistor P31 is coupled between node (n1) and transistor N30, and transistor P31 is activated by the node voltage at node (t_n1).

Also, transistors N31 and N32 are coupled in series between the first reference voltage signal (refn) and transistor P32. Transistor N31 is activated by the node voltage at node (t_n1), and transistor N32 is activated by the node voltage at node (n2). The second reference tracking voltage signal (refn_track) is coupled to the node disposed between transistors N32, P32. Transistor P32 is coupled between node (n1) and transistor N32, and transistor P32 is activated by the node voltage at node (t_n1).

Also, transistors N33 and N34 are coupled in series between the first reference voltage signal (refp) and transistor P33. Transistor N33 is activated by the node voltage at node (t_n1), and transistor N34 is activated by the node voltage at node (n2). The rx_ctrl signal is coupled to the node disposed between transistors N33, N34. Transistor P33 is coupled between node (n3) and transistor N34, and transistor P33 is activated by the node voltage at node (n2).

Also, transistor P34 is coupled between the node for the rx_ctrl voltage signal and the node for the well_ctrl voltage signal, and transistor P34 is activated by the node voltage at node (n2). Transistors P35 and P36 are coupled in parallel between the node (n2) and the node for the well_ctrl voltage signal. Transistor P35 is activated by the rx_ctrl voltage signal, and transistor P36 is activated by the well_ctrl voltage signal. Transistor N35 is coupled between the second voltage signal (NG) and the ground voltage (Dvss), and transistor N35 is activated by the Res_ctrl voltage signal.

Also, transistor N36 is coupled between the padby2 voltage signal and the node for the Rx_In voltage signal, and transistor N36 is activated by the rx_ctrl voltage signal. Transistors N37, N38, N39 are coupled in parallel between the node (padr) and the node for the rx_ctrl voltage signal. Transistor N37 is activated by the node voltage signal at node (n1), transistor N38 is activated by the max_n1_refn voltage signal, and transistor N39 is activated by the rx_ctrl voltage signal.

As shown in FIG. 6B, the second circuit part of the third stage circuitry 330 may include multiple transistors of different types, such as, e.g., P-type transistors (P40, P41, P42, P43, P44, P45) and N-type transistors (N40, N41, N42, N43, N44, N45), that are coupled together, arranged, and configured to operate as the second circuit part of the third stage circuitry 330.

For instance, transistors N40, N41, N42 are coupled in series between the first reference voltage signal (refp) and the node for the first reference tracking voltage signal (refp_track). Transistor N40 is activated by the node voltage at node (oe_p), transistor N41 is activated by the node voltage at node (t_n1), and transistor N42 is activated by the node voltage at node (n2). Transistor P40 is coupled between node (n3) and the node for the first reference tracking voltage signal (refp_track), and transistor P40 is activated by the node voltage at node (n2). Transistor P41 is coupled between node (n1) and the node for the first reference tracking voltage signal (refp_track), and also, transistor P41 is activated by the first reference tracking voltage signal (refp_track).

Also, transistors P42 and N43 are coupled in series between the voltage supply signal Dvdd and the node for the first reference voltage signal (refp). Transistor P42 is activated by the oe_p voltage signal, and transistor N43 is activated by the oe_p voltage signal. Transistors P42, N43 are coupled to operate as an inverter and provide the oeb_p voltage signal as an inversion of the oe_p voltage signal. The node (oeb_p) is disposed between the transistors P42, N43, and transistor P43 is coupled between the node for the oeb_p voltage signal and node (n4). Transistors N44 and P44 are couple din parallel between node (n4) and node (n1). Transistor N44 is activated by the oe_p voltage signal, and transistor P44 is activated by the oeb_p voltage signal. Transistors N45 and P45 are coupled between the node for the first reference tracking voltage signal (refp_track) and node (n3). Transistor N45 is activated by the node voltage at node (n4), and transistor P45 is activated by the node voltage at node (n1).

Figure 7:
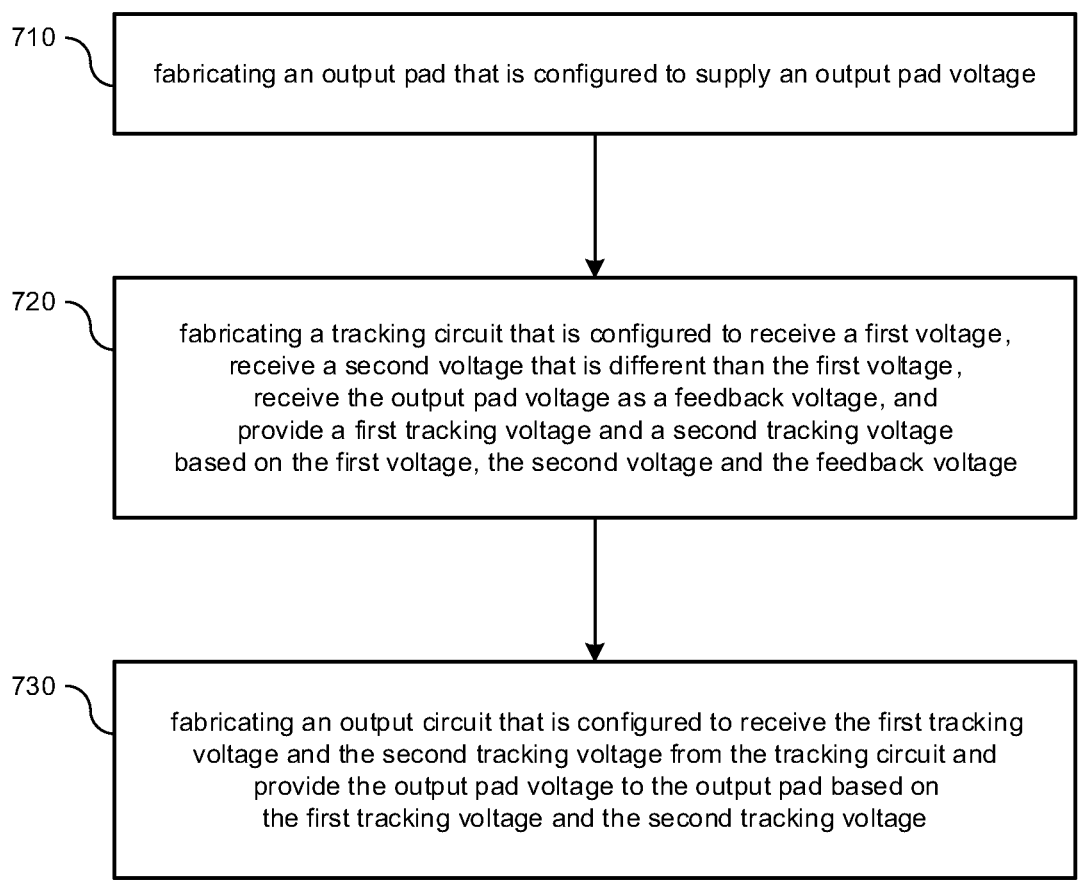
FIG. 7 illustrates a process diagram of a method for providing voltage tracking circuitry in accordance with various implementations described herein.

FIG. 7 illustrates a process flow diagram 700 of a method for providing voltage tracking circuitry in accordance with implementations described herein.

It should be understood that even though method 700 indicates a particular order of operation execution, in some cases, various certain portions of the operations may be executed in a different order, and on different systems. In other cases, additional operations and/or steps may be added to and/or omitted from method 700. Also, method 700 may be implemented in hardware and/or software. If implemented in hardware, the method 700 may be implemented with various components and/or circuitry, as described herein in reference to FIGS. 1-6B. Also, if implemented in software, method 700 may be implemented as a program and/or software instruction process configured for providing voltage tracking schemes and techniques, as described herein. Also, if implemented in software, instructions related to implementing the method 700 may be stored in memory and/or a database. For instance, a computer or various other types of computing devices having a processor and memory may be configured to perform method 700.

In various implementations, method 700 may refer to a method of designing, providing, building and/or manufacturing voltage tracking circuitry as an integrated system, device and/or circuit that may involve use of the various IC circuit components described herein so as to thereby implement voltage tracking schemes and techniques associated therewith. The voltage tracking circuitry may be integrated with computing circuitry and related components on a single chip, and the voltage tracking circuitry may be implemented in various embedded systems for various electronic, mobile and Internet-of-things (IoT) applications, including sensor nodes.

At block 710, method 700 may fabricate an output pad that is configured to supply an output pad voltage. At block 720, method 700 may fabricate a tracking circuit that is configured to receive a first voltage, receive a second voltage that is different than the first voltage, receive the output pad voltage as a feedback voltage, and provide a first tracking voltage and a second tracking voltage based on the first voltage, the second voltage and the feedback voltage. Also, at block 730, method 700 may fabricate an output circuit that is configured to receive the first tracking voltage and the second tracking voltage from the tracking circuit and provide the output pad voltage to the output pad based on the first tracking voltage and the second tracking voltage.

In some implementations, the first voltage may refer to a first operating voltage in a first range, and the second voltage may refer to a second operating voltage in a second range that is different than the first range. The tracking circuitry may be configured to receive a first reference signal related to the first operating voltage, receive a second reference signal related to the second operating voltage, provide a first reference tracking voltage based on the first reference voltage, and provide a second reference tracking voltage based on the second reference voltage. The output circuitry may include multiple switch structures that are configured to receive the first tracking voltage from the tracking circuitry, receive the second tracking voltage from the tracking circuitry, and provide the output pad voltage to the output pad based on the first tracking voltage and the second tracking voltage. The switch structures include a first transistor and a second transistor, wherein the first transistor may be coupled between a first supply voltage and the second transistor, and the second transistor may be coupled between the first transistor and an output pad. Also, the first supply voltage may be provided to the output pad as the output pad voltage when the first transistor and the second transistor are activated. The tracking circuitry may provide the first tracking signal to a gate of the first transistor, and the first transistor may provide the first supply voltage to the second transistor when activated by the first tracking signal. The tracking circuitry provides the first reference tracking signal to a gate of the second transistor, and the second transistor provides the first supply voltage to the output pad when activated by the second reference tracking signal.

In some instances, the switch structures include a third transistor and a fourth transistor, wherein the third transistor may be coupled between the output pad and the fourth transistor, and the fourth transistor may be coupled between the third transistor and a second supply voltage. Also, the second supply voltage may be provided to the output pad as the output pad voltage when the third transistor and the fourth transistor are activated. The tracking circuitry may provide the second tracking signal to a gate of the fourth transistor, and the fourth transistor may provide the second supply voltage to the third transistor when activated by the second tracking signal. The tracking circuitry may provide the second reference tracking signal to a gate of the third transistor, and the third transistor may provide the second supply voltage to the output pad when activated by the second reference tracking signal.

In some instances, the first supply voltage may be between a first intermediate voltage (1.5V, 0.7V, 0V) and an upper boundary voltage (3.3V, 2.5V, 1.8V), and also, the second supply voltage may be between a lower boundary voltage (0V) and a second intermediate voltage (1.8V). During a fail-safe condition, the first supply voltage may refer to the lower boundary voltage (0V), and the output pad voltage may refer to the upper boundary voltage (3.3V). During a first mode of operation, the first supply voltage may refer to the upper boundary voltage at a first level (3.3V), the second reference voltage may refer to the second intermediate voltage (1.8V), and the second supply voltage may refer to the lower boundary voltage (0V). Also, in this instance, the first reference voltage may refer to the upper boundary voltage at the first level (3.3V) minus the second intermediate voltage (1.8V), which refers to the first intermediate voltage (1.5V).

In some instances, during a second mode of operation, the first supply voltage may refer to the upper boundary voltage at a second level 2.5V that is less than the first level (3.3V), the second reference voltage may refer to the second intermediate voltage (1.8V), and the second supply voltage may refer to the lower boundary voltage (0V). Also, in this instance, the first reference voltage may refer to the upper boundary voltage at the second level 2.5V minus the second intermediate voltage (1.8V), which is (0.7V).

In some instances, during a third mode of operation, the first supply voltage may refer to the upper boundary voltage at a third level (1.8V) that is less than the second level 2.5V, the second reference voltage may refer to the second intermediate voltage (1.8V), and the second supply voltage may refer to the lower boundary voltage (0V). Also, in this instance, the first reference voltage may refer to the upper boundary voltage at the third level (1.8V) minus the second intermediate voltage (1.8V), which refers to the lower boundary voltage (0V).

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device. The device may include an output pad that is configured to supply an output pad voltage. The device may include tracking circuitry that is configured to receive a first voltage, receive a second voltage that is different than the first voltage, receive the output pad voltage as a feedback voltage, and provide a first tracking voltage and a second tracking voltage based on the first voltage, the second voltage and the feedback voltage. The device may include output circuitry that is configured to receive the first tracking voltage and the second tracking voltage from the tracking circuitry and provide the output pad voltage to the output pad based on the first tracking voltage and the second tracking voltage.

Described herein are various implementations of a voltage tracking circuit. The voltage tracking circuit may include an output stage having output transistors that are configured to receive a first tracking signal, receive a second tracking signal, and provide an output pad signal to an output pad based on the first tracking signal and the second tracking signal. The voltage tracking circuit may include a feedback stage that is configured to receive the output pad signal from the output stage and provide a pad feedback signal based on the output pad signal. The voltage tracking circuit may include a tracking stage that is configured to receive a first signal, receive a second signal that is different than the first signal, receive the output pad signal from the output pad, receive the pad feedback signal from the feedback stage, and provide the first tracking signal and the second tracking signal to the output stage based on the first signal, the second signal, the output pad signal, and the pad feedback signal.

Described herein are various implementations of a method for manufacturing an integrated circuit. The method may include fabricating an output pad that is configured to supply an output pad voltage. The method may include fabricating a tracking circuit that is configured to receive a first voltage, receive a second voltage that is different than the first voltage, receive the output pad voltage as a feedback voltage, and provide a first tracking voltage and a second tracking voltage based on the first voltage, the second voltage and the feedback voltage. The method may include fabricating an output circuit that is configured to receive the first tracking voltage and the second tracking voltage from the tracking circuit and provide the output pad voltage to the output pad based on the first tracking voltage and the second tracking voltage.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A device, comprising:
  an output pad that is configured to supply an output pad voltage;
  tracking circuitry that is configured to receive a first voltage, receive a second voltage that is different than the first voltage, receive the output pad voltage as a feedback voltage, and provide a first tracking voltage and a second tracking voltage based on the first voltage, the second voltage and the feedback voltage; and
  output circuitry that is configured to receive the first tracking voltage and the second tracking voltage from the tracking circuitry and provide the output pad voltage to the output pad based on the first tracking voltage and the second tracking voltage;
  wherein the first voltage refers to a first operating voltage in a first range, and wherein the second voltage refers to a second operating voltage in a second range that is different than the first range;
  wherein the tracking circuitry is configured to receive a first reference voltage related to the first operating voltage, receive a second reference voltage related to the second operating voltage, provide a first reference tracking voltage based on the first reference voltage, and provide a second reference tracking voltage based on the second reference voltage;
  wherein the output circuitry includes switch structures that are configured to receive the first tracking voltage from the tracking circuitry, receive the second tracking voltage from the tracking circuitry, and provide the output pad voltage to the output pad based on the first tracking voltage and the second tracking voltage;
  wherein the switch structures include a first transistor and a second transistor, wherein the first transistor is coupled between a first supply voltage and the second transistor, wherein the second transistor is coupled between the first transistor and an output pad, and wherein the first supply voltage is provided to the output pad as the output pad voltage when the first transistor and the second transistor are activated;

wherein the switch structures include a third transistor and a fourth transistor, wherein the third transistor is coupled between the output pad and the fourth transistor, wherein the fourth transistor is coupled between the third transistor and a second supply voltage, and wherein the second supply voltage is provided to the output pad as the output pad voltage when the third transistor and the fourth transistor are activated;

wherein the first supply voltage is between a first intermediate voltage and an upper boundary voltage, and wherein the second supply voltage is between a lower boundary voltage and a second intermediate voltage;

wherein during a first mode of operation, the first supply voltage is similar to the upper boundary voltage at a first level, the second reference voltage is similar to the second intermediate voltage, and the second supply voltage is similar to the lower boundary voltage, and wherein the first reference voltage is similar to the upper boundary voltage at the first level minus the second intermediate voltage, which refers to the first intermediate voltage.

2. The device of claim 1, wherein the tracking circuitry provides the first tracking voltage to a gate of the first transistor, and wherein the first transistor provides the first supply voltage to the second transistor when activated by the first tracking voltage.

3. The device of claim 2, wherein the tracking circuitry provides the first reference tracking voltage to a gate of the second transistor, and wherein the second transistor provides the first supply voltage to the output pad when activated by the second reference tracking voltage.

4. The device of claim 1, wherein the tracking circuitry provides the second tracking voltage to a gate of the fourth transistor, and wherein the fourth transistor provides the second supply voltage to the third transistor when activated by the second tracking voltage.

5. The device of claim 4, wherein the tracking circuitry provides the second reference tracking voltage to a gate of the third transistor, and wherein the third transistor provides the second supply voltage to the output pad when activated by the second reference tracking voltage.

6. The device of claim 1, wherein during a fail-safe condition, the first supply voltage is similar to the lower boundary voltage, and the output pad voltage is similar to the upper boundary voltage.

7. A device, comprising:

an output pad that is configured to supply an output pad voltage;

tracking circuitry that is configured to receive a first voltage, receive a second voltage that is different than the first voltage, receive the output pad voltage as a feedback voltage, and provide a first tracking voltage and a second tracking voltage based on the first voltage, the second voltage and the feedback voltage; and output circuitry that is configured to receive the first tracking voltage and the second tracking voltage from the tracking circuitry and provide the output pad voltage to the output pad based on the first tracking voltage and the second tracking voltage;

wherein the first voltage refers to a first operating voltage in a first range, and wherein the second voltage refers to a second operating voltage in a second range that is different than the first range;

wherein the tracking circuitry is configured to receive a first reference voltage related to the first operating voltage, receive a second reference voltage related to the second operating voltage, provide a first reference tracking voltage based on the first reference voltage, and provide a second reference tracking voltage based on the second reference voltage;

wherein the output circuitry includes switch structures that are configured to receive the first tracking voltage from the tracking circuitry, receive the second tracking voltage from the tracking circuitry, and provide the output pad voltage to the output pad based on the first tracking voltage and the second tracking voltage;

wherein the switch structures include a first transistor and a second transistor, wherein the first transistor is coupled between a first supply voltage and the second transistor, wherein the second transistor is coupled between the first transistor and an output pad, and wherein the first supply voltage is provided to the output pad as the output pad voltage when the first transistor and the second transistor are activated;

wherein the switch structures include a third transistor and a fourth transistor, wherein the third transistor is coupled between the output pad and the fourth transistor, wherein the fourth transistor is coupled between the third transistor and a second supply voltage, and wherein the second supply voltage is provided to the output pad as the output pad voltage when the third transistor and the fourth transistor are activated;

wherein the first supply voltage is between a first intermediate voltage and an upper boundary voltage, and wherein the second supply voltage is between a lower boundary voltage and a second intermediate voltage;

wherein during a second mode of operation, the first supply voltage is similar to the upper boundary voltage at a second level that is less than the first level, the second reference voltage is similar to the second intermediate voltage, and the second supply voltage is similar to the lower boundary voltage, and wherein the first reference voltage is similar to the upper boundary voltage at the second level minus the second intermediate voltage.

8. A device, comprising:

an output pad that is configured to supply an output pad voltage;

tracking circuitry that is configured to receive a first voltage, receive a second voltage that is different than the first voltage, receive the output pad voltage as a feedback voltage, and provide a first tracking voltage and a second tracking voltage based on the first voltage, the second voltage and the feedback voltage; and output circuitry that is configured to receive the first tracking voltage and the second tracking voltage from the tracking circuitry and provide the output pad voltage to the output pad based on the first tracking voltage and the second tracking voltage;

wherein the first voltage refers to a first operating voltage in a first range, and wherein the second voltage refers to a second operating voltage in a second range that is different than the first range;

wherein the tracking circuitry is configured to receive a first reference voltage related to the first operating voltage, receive a second reference voltage related to the second operating voltage, provide a first reference tracking voltage based on the first reference voltage, and provide a second reference tracking voltage based on the second reference voltage;

wherein the output circuitry includes switch structures that are configured to receive the first tracking voltage from the tracking circuitry, receive the second tracking voltage from the tracking circuitry, and provide the output pad voltage to the output pad based on the first tracking voltage and the second tracking voltage;

wherein the switch structures include a first transistor and a second transistor, wherein the first transistor is coupled between a first supply voltage and the second transistor, wherein the second transistor is coupled between the first transistor and an output pad, and wherein the first supply voltage is provided to the output pad as the output pad voltage when the first transistor and the second transistor are activated;

wherein the switch structures include a third transistor and a fourth transistor, wherein the third transistor is coupled between the output pad and the fourth transistor, wherein the fourth transistor is coupled between the third transistor and a second supply voltage, and wherein the second supply voltage is provided to the output pad as the output pad voltage when the third transistor and the fourth transistor are activated;

wherein the first supply voltage is between a first intermediate voltage and an upper boundary voltage, and wherein the second supply voltage is between a lower boundary voltage and a second intermediate voltage;

wherein during a third mode of operation, the first supply voltage is similar to the upper boundary voltage at a third level that is less than the second level, the second reference voltage is similar to the second intermediate voltage, and the second supply voltage is similar to the lower boundary voltage, and wherein the first reference voltage is similar to the upper boundary voltage at the third level minus the second intermediate voltage, which refers to the lower boundary voltage.

9. A voltage tracking circuit, comprising:

an output stage having output transistors that are configured to receive a first tracking signal, receive a second tracking signal, and provide an output pad signal to an output pad based on the first tracking signal and the second tracking signal;

a feedback stage that is configured to receive the output pad signal from the output stage and provide a pad feedback signal based on the output pad signal; and a tracking stage that is configured to receive a first signal, receive a second signal that is different than the first signal, receive the output pad signal from the output pad, receive the pad feedback signal from the feedback stage, and provide the first tracking signal and the second tracking signal to the output stage based on the first signal, the second signal, the output pad signal, and the pad feedback signal;

wherein the output transistors include a first transistor and a second transistor, wherein the first transistor is coupled between a first supply voltage and the second transistor, wherein the second transistor is coupled between the first transistor and the output pad, and wherein the first supply voltage is provided to the output pad as the output pad voltage when the first transistor and the second transistor are activated;

wherein the output transistors include a third transistor and a fourth transistor, wherein the third transistor is coupled between the output pad and the fourth transistor, wherein the fourth transistor is coupled between the third transistor and a second supply voltage, and wherein the second supply voltage is provided to the output pad as the output pad voltage when the third transistor and the fourth transistor are activated;

wherein the first supply voltage is between a first intermediate voltage and an upper boundary voltage, and wherein the second supply voltage is between a lower boundary voltage and a second intermediate voltage;

wherein during a first mode of operation, the first supply voltage is similar to the upper boundary voltage at a first level, a second reference signal is similar to the second intermediate voltage, and the second supply voltage is similar to the lower boundary voltage, and wherein a first reference signal is similar to the upper boundary voltage at the first level minus the second intermediate voltage, which refers to the first intermediate voltage.

10. The circuit of claim 9, wherein:

the tracking stage is configured to receive the first reference signal, receive the second reference signal that is different than the first reference signal, and provide a first reference tracking signal and a second reference tracking signal based on the first reference signal and the second reference signal, and the output transistors of the output stage are configured to receive the first reference tracking signal, receive the second reference tracking signal, and provide the output pad signal to the output pad based on the first tracking signal, the second tracking signal, the first reference tracking signal, and the second reference tracking signal.

11. The circuit of claim 9, wherein:

the tracking stage provides the first tracking signal to a gate of the first transistor, and the first transistor provides the first supply voltage to the second transistor when activated by the first tracking signal, the tracking stage provides the first reference tracking signal to a gate of the second transistor, and the second transistor provides the first supply voltage to the output pad when activated by the first reference tracking signal, the tracking stage provides the second tracking signal to a gate of the fourth transistor, and the fourth transistor provides the second supply voltage to the third transistor when activated by the second tracking signal, and the tracking stage provides the second reference tracking signal to a gate of the third transistor, and the third transistor provides the second supply voltage to the output pad when activated by the second reference tracking signal.

12. A method, comprising:

fabricating an output pad that is configured to supply an output pad voltage;

fabricating a tracking circuit that is configured to receive a first voltage, receive a second voltage that is different than the first voltage, receive the output pad voltage as a feedback voltage, and provide a first tracking voltage and a second tracking voltage based on the first voltage, the second voltage and the feedback voltage; and fabricating an output circuit that is configured to receive the first tracking voltage and the second tracking voltage from the tracking circuit and provide the output pad voltage to the output pad based on the first tracking voltage and the second tracking voltage;

wherein the first voltage refers to a first operating voltage in a first range, and wherein the second voltage refers to a second operating voltage in a second range that is different than the first range;

wherein the tracking circuitry is configured to receive a first reference voltage related to the first operating voltage, receive a second reference voltage related to the second operating voltage, provide a first reference tracking voltage based on the first reference voltage, and provide a second reference tracking voltage based on the second reference voltage;

wherein the output circuitry includes switch structures that are configured to receive the first tracking voltage from the tracking circuitry, receive the second tracking voltage from the tracking circuitry, and provide the output pad voltage to the output pad based on the first tracking voltage and the second tracking voltage;

wherein the switch structures include a first transistor and a second transistor, wherein the first transistor is coupled between a first supply voltage and the second transistor, wherein the second transistor is coupled between the first transistor and an output pad, and wherein the first supply voltage is provided to the output pad as the output pad voltage when the first transistor and the second transistor are activated;

wherein the switch structures include a third transistor and a fourth transistor, wherein the third transistor is coupled between the output pad and the fourth transistor, wherein the fourth transistor is coupled between the third transistor and a second supply voltage, and wherein the second supply voltage is provided to the output pad as the output pad voltage when the third transistor and the fourth transistor are activated;

wherein the first supply voltage is between a first intermediate voltage and an upper boundary voltage, and wherein the second supply voltage is between a lower boundary voltage and a second intermediate voltage;

wherein during a first mode of operation, the first supply voltage is similar to the upper boundary voltage at a first level, the second reference voltage is similar to the second intermediate voltage, and the second supply voltage is similar to the lower boundary voltage, and wherein the first reference voltage is similar to the upper boundary voltage at the first level minus the second intermediate voltage, which refers to the first intermediate voltage.

* * * * *